United States Patent
González

(10) Patent No.: US 6,479,880 B1
(45) Date of Patent: Nov. 12, 2002

(54) FLOATING GATE ISOLATION DEVICE

(75) Inventor: Fernando González, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 47 days.

(21) Appl. No.: 09/639,623

(22) Filed: Aug. 15, 2000

Related U.S. Application Data

(60) Continuation of application No. 08/905,617, filed on Aug. 4, 1997, now Pat. No. 6,130,140, which is a division of application No. 08/276,511, filed on Jul. 14, 1994, now Pat. No. 5,693,971.

(51) Int. Cl.[7] .................. H01L 29/00; H01L 29/76; H01L 29/94; H01L 21/76; H01L 21/336
(52) U.S. Cl. ............... 257/508; 257/409; 257/501; 257/510; 257/506; 257/523; 438/454; 438/430; 438/424; 438/400; 438/259
(58) Field of Search ............. 257/314, 68, 71, 257/508, 409, 354, 501, 510, 524, 566, 523; 438/430, 454, 429, 424–5, 400, 259; 148/DIG. 85

(56) References Cited

U.S. PATENT DOCUMENTS

| | | | |
|---|---|---|---|
| 4,528,047 A | 7/1985 | Beyer et al. ........... 148/175 |
| 4,698,900 A | * 10/1987 | Esquivel ............... 437/52 |
| 4,758,531 A | 7/1988 | Beyer et al. ........... 437/90 |
| 4,763,180 A | * 8/1988 | Hwang et al. ......... 257/302 |
| 4,789,885 A | 12/1988 | Brighten et al. ........ 357/34 |
| 4,868,631 A | 9/1989 | Hollingsworth et al. .. 357/48 |
| 4,896,197 A | 1/1990 | Mashiko ............... 257/303 |
| 4,922,318 A | 5/1990 | Thomas et al. ......... 357/43 |
| 4,980,734 A | 12/1990 | Inoue ................. 357/23.6 |
| 5,017,977 A | * 5/1991 | Richardson ............ 257/316 |
| 5,061,653 A | 10/1991 | Teng ................... 437/67 |
| 5,075,817 A | 12/1991 | Butler ................. 361/313 |
| 5,111,272 A | 5/1992 | Miyashita et al. ....... 357/49 |
| 5,112,772 A | 5/1992 | Wilson et al. .......... 437/67 |
| 5,148,247 A | 9/1992 | Miura et al. ........... 257/236 |

(List continued on next page.)

FOREIGN PATENT DOCUMENTS

| | | | |
|---|---|---|---|
| JP | 60-194573 | 10/1985 | ........... 27/115 G |
| JP | 3-233974 | 10/1991 | ........... 27/115 G |
| JP | 3-257873 | 11/1991 | ........... 27/115 G |
| JP | 3-270175 | 12/1991 | ........... 27/115 G |

OTHER PUBLICATIONS

Banerjee et al., Leakage Meachanisms in the Trench Transistor Dram Cell, (IEEE), pp. 108–116, 1988.*

Wolsterholme, Graham R. and Bergemont, Albert, A Novel Isolation Scheme for Implementation in Very High Density AMG EPROM and Flash EEPROM Arrays, National Semiconductor, Santa Clara, CA 95052, USA.

Primary Examiner—Wael Fahmy
Assistant Examiner—Neal Berezny
(74) Attorney, Agent, or Firm—Ormiston & McKinney, PLLC

(57) ABSTRACT

An isolation structure providing electrical isolation in two dimensions between memory cells in semiconductor memory device. The isolation structure comprises a trench formed in a substrate of a semiconductor memory device such as a Dynamic Random Access Memory (DRAM). The trench is lined with an insulating material and filled with polysilicon to form a floating gate. An electrical charge is then injected into the polysilicon floating gate. The isolation structure is located between memory cells in an array to provide isolation between cells in sub-micron spacing by combining the characteristics of trench and field isolation. The electrical charge is injected into the polysilicon floating gate by applying a charging voltage to the wordlines of the memory cell array. The charging voltage is applied periodically as necessary to maintain effective isolation. Two dimensional isolation is achieved by extending the trench to surround each pair of memory cells sharing a common bitline contact.

2 Claims, 5 Drawing Sheets

U.S. PATENT DOCUMENTS

| | | | |
|---|---|---|---|
| 5,170,372 A | 12/1992 | Wong | 257/304 |
| RE34,158 E | 1/1993 | Watanabe et al. | 257/370 |
| 5,179,038 A | 1/1993 | Kinney et al. | 437/78 |
| 5,196,722 A * | 3/1993 | Bergendahl | 257/304 |
| 5,223,447 A * | 6/1993 | Lee et al. | 437/47 |
| 5,245,569 A | 9/1993 | Gonzalez | 365/182 |
| 5,248,894 A | 9/1993 | Beasom | 257/519 |
| 5,276,338 A | 1/1994 | Beyer et al. | 257/52 |
| 5,291,047 A | 3/1994 | Iwasa | 257/318 |
| 5,298,450 A | 3/1994 | Verrett | 437/67 |
| 5,387,534 A * | 2/1995 | Prall | 437/52 |
| 5,502,320 A | 3/1996 | Yamada | 257/302 |
| 5,567,635 A | 10/1996 | Acovic et al. | 437/43 |
| 5,616,510 A * | 4/1997 | Wong | 438/259 |
| 5,693,971 A | 12/1997 | Gonzalez | 257/314 |

* cited by examiner

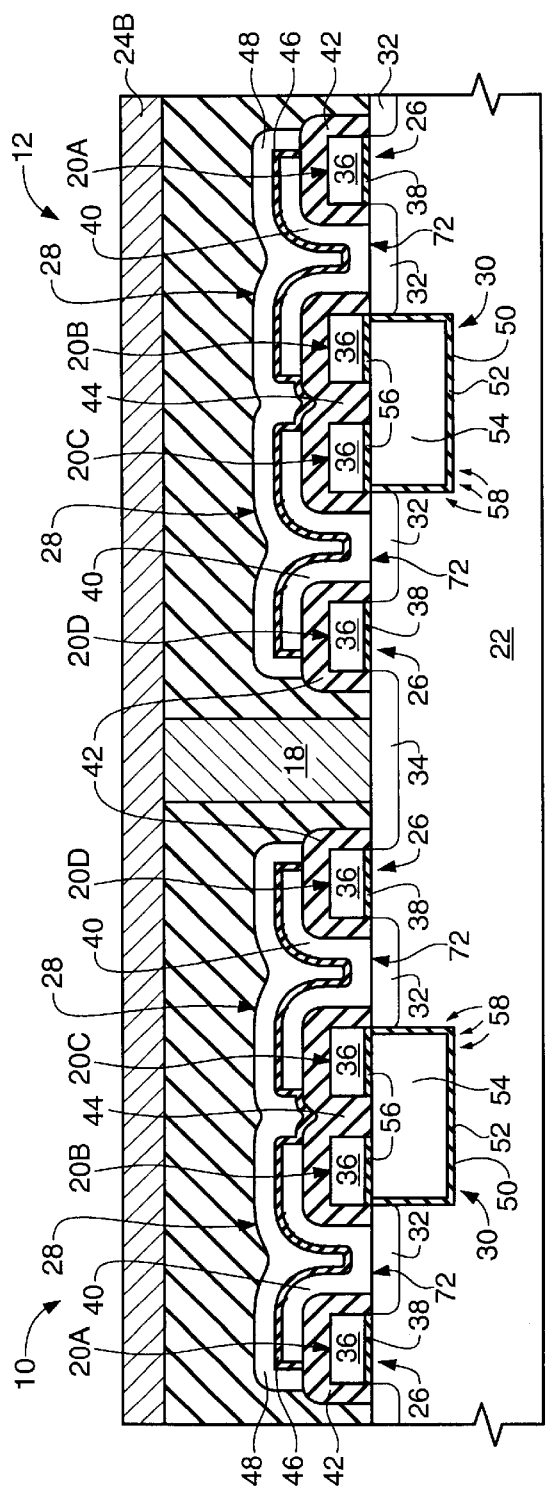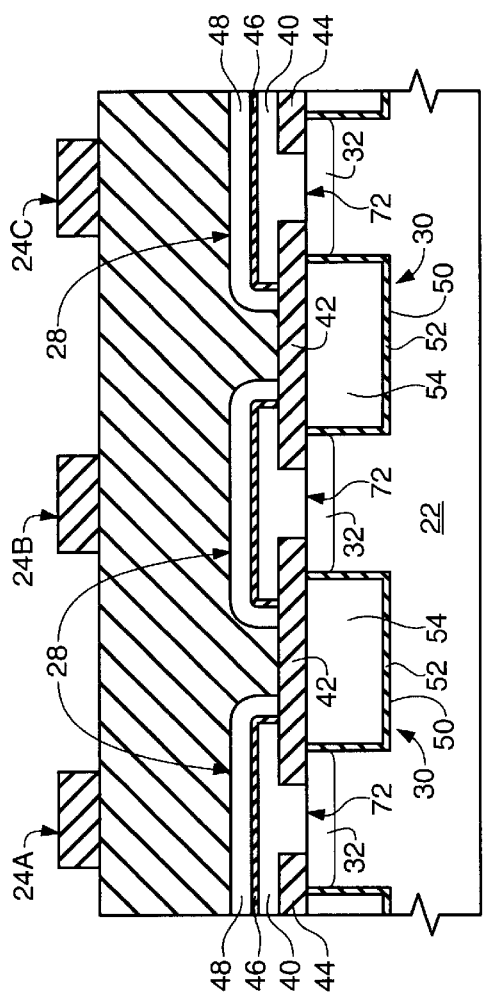

FLOATING GATE ISOLATION DEVICE

This is a continuation of application Ser. No. 08/905,617 filed Aug. 4, 1997, now U.S. Pat. No. 6,130,140 which is a divisional of application Ser. No. 08/276,511 filed Jul. 14, 1994, now U.S. Pat. No. 5,693,971.

FIELD OF THE INVENTION

The present invention relates generally to semiconductor memory devices, and more specifically to trench and field isolation of memory cells in such devices.

BACKGROUND OF THE INVENTION

The growing demand for increasingly smaller semiconductor memory devices having large memory capacities capable of high speed operation has pushed the development of miniaturized memory cell structures in Dynamic Random Access Memory devices (DRAMs). DRAMs, which are capable of inputting and outputting data at random, generally comprise an array of memory cells for storing data and peripheral circuits for controlling data in the memory cells. Each memory cell in a DRAM stores one bit of data and consists of one transistor and one capacitor. Within the array, each memory cell must be electrically isolated from adjacent memory cells.

The degree to which large numbers of memory cells can be integrated into a single integrated circuit (IC) chip is effected primarily by the size of the transistors and capacitors in and the isolating structures between memory cells. The miniaturization of DRAM memory cell transistors and capacitors to 0.35 micron and smaller field width or active area spacing has created the need for corresponding miniaturization of the isolating structures. It is this need for smaller isolating structures that the present invention addresses.

Currently, memory cell isolation is achieved using an oxide film formed by the Local Oxidation Of Silicon (LOCOS) or recessed LOCOS methods, trench isolation, or field isolation. Using LOCOS, a relatively thick oxide region is formed around each cell. As the size of the cell structure is reduced, the corresponding reduction in the size of the oxide region creates several problems. First, for submicron cell spacing, the oxide thinning that occurs with miniaturization is detrimental to isolation. Second, the oxide film regions become the smallest mask feature in the array and, therefore, limit scaling/miniaturization. Third, the field oxide regions form the largest step height in the array. This effects the intermediate BPSG insulation layer and increases the aspect ratio (height to width) of the metal contact, making it more difficult to etch the contact hole. Fourth, in the LOCOS method, an oxide projection commonly referred to as a "bird's beak" forms at the periphery of the thick oxide region and extends into the area in which the cell is formed. The bird s beak reduces the area available for cell formation. This problem is exacerbated by the fact that the size of the bird's beak remains constant evenas the size of the LOCOS oxide region is reduced. For these various reasons, the LOCOS method impedes miniaturization of the memory cell array particularly below about 0.35 micron spacing.

Trench isolation utilizes a trench etched into the substrate between memory cells. The trench must have sufficient width and depth to create a physical barrier to current conduction between cells. As the cell spacing is reduced below about 0.35 microns, the aspect ratio of the trench necessary for isolation becomes severe so that it is difficult to etch the trench to the required depth.

Field shield isolation utilizes a shielding electrode formed over the substrate between the source and drain regions of adjacent memory cells. Cell isolation is achieved by applying a low potential to the shielding electrode to prevent current conduction between adjacent memory cells. However, because the shielding electrode occupies space above the substrate in the memory cell array, it is an impediment to further miniaturization. In addition, isolation in the memory cell array for submicron spacing is only achieved as long as a voltage is being applied to the shielding electrode.

A similar method used to overcome the disadvantages of LOCOS in EPROMs and Flash EEPROMs involves replacing the LOCOS regions with EPROM cells. This method of isolation and corresponding structure is described in an article entitled, *A Novel Isolation Scheme for Implementation in Very High Density AMG EPROM and FLASH EEPROM Arrays*, MICROELECTRONIC ENGINEERING, Vol. 19, pp. 253–6 (1992). The EPROM isolation cells disclosed therein are floating gate devices within the array. The programming sequence determines whether any given cell will be a memory cell or an isolation cell. This method uses the high programming voltage already available in the flash circuit. As with field shield isolation, the EPROM isolation structure occupies space in the array above the substrate. In addition, the isolation cell provides isolation in only one direction. LOCOS isolation must also be used to provide isolation in the perpendicular direction to achieve two dimensional isolation.

The present invention is directed to minimizing or eliminating the disadvantages of the LOCOS, trench and field shield isolation structures currently used in the art for cell spacing at or below about 0.35 microns.

SUMMARY OF THE INVENTION

It is therefore a principal object of the present invention to provide an isolation structure and method for forming the same that effectively isolates cells in very small cell spacing to allow high density integration of IC chips.

It is another object to combine the advantages of field isolation and trench isolation in a single isolation structure to provide effective isolation between cells in very small cell spacing.

It is another object to provide an isolation structure that effectively isolates cells in field width or active area spacing on the order of 0.1–0.25 microns.

It is another object to provide isolation in two dimensions in the memory cell array.

It is, another object to provide a field isolation structure that requires only periodic charging to maintain its isolation characteristics.

The above objects are achieved by an isolation structure for semiconductor memory devices comprising a trench formed in the substrate. The trench is lined with insulating material and filled with polysilicon. An electrical charge is then injected into the polysilicon. This isolation structure can be located between memory cells in the array and, thus, provide effective isolation between cells in very small spacing by combining the characteristics of trench and field isolation. The trench in the present invention need not be as deep or as wide as that required for conventional trench isolation because the physical isolation of the trench is enhanced by the field isolation of the charged polysilicon. Unlike conventional field isolation wherein the shielding electrode occupies space above the substrate in the array area of the device, the shielding electrode component is buried in the substrate, thus providing effective isolation in very small cell spacing.

In another aspect of the invention, the electrical charge is injected into the polysilicon by means of the wordlines of the memory cell array. In this aspect of the invention, the surface of the polysilicon in the trench is made substantially coplanar with the top of the trench and overlayed with insulating material to form a floating gate. A layer of polysilicon overlays the insulating layer above the floating gate. The layer of polysilicon will typically be a wordline in a memory cell array having a plurality of wordlines and a plurality of bitlines arranged generally perpendicular to one another over the substrate. An electrical charge is injected into the floating gate by applying a charging voltage to the wordline, whereby Fowler-Nordheim currents are generated in the substrate for charging the floating gate. The charging voltage can then be removed and the wordline used in the operational circuit of the IC chip. The charging voltage need be applied only periodically when the charge on the floating gate falls below a level at which effective isolation can no longer be maintained.

The isolation structure of the present invention will typically be located between adjacent cells in the array beneath and overlapping multiple wordlines. Two dimensional isolation can be achieved by extending the trench to surround each pair of memory cells sharing a common bitline contact.

The foregoing and other objects, advantages and novel features of the invention will become apparent to those skilled in the art from the following detailed description, wherein I have shown and described only the preferred embodiments of the invention simply by way of illustrating the best mode contemplated by me of carrying out the invention. As will be realized, the invention is capable of other and, different embodiments and use in other applications, and its several details are capable of modifications in various obvious respects, all without departing from the invention. Accordingly, the drawings and, description are to be regarded as illustrative in nature, and, not as restrictive.

BRIEF DESCRIPTION OF THE DRAWINGS

FIG. 2A is a cross section view taken along line A—A in FIG. 1 illustrating the invention in a stacked capacitor DRAM.

FIG. 2B is a cross section view taken along line B—B in FIG. 1.

DETAILED OF THE PREFERRED EMBODIMENTS

Figure 1:
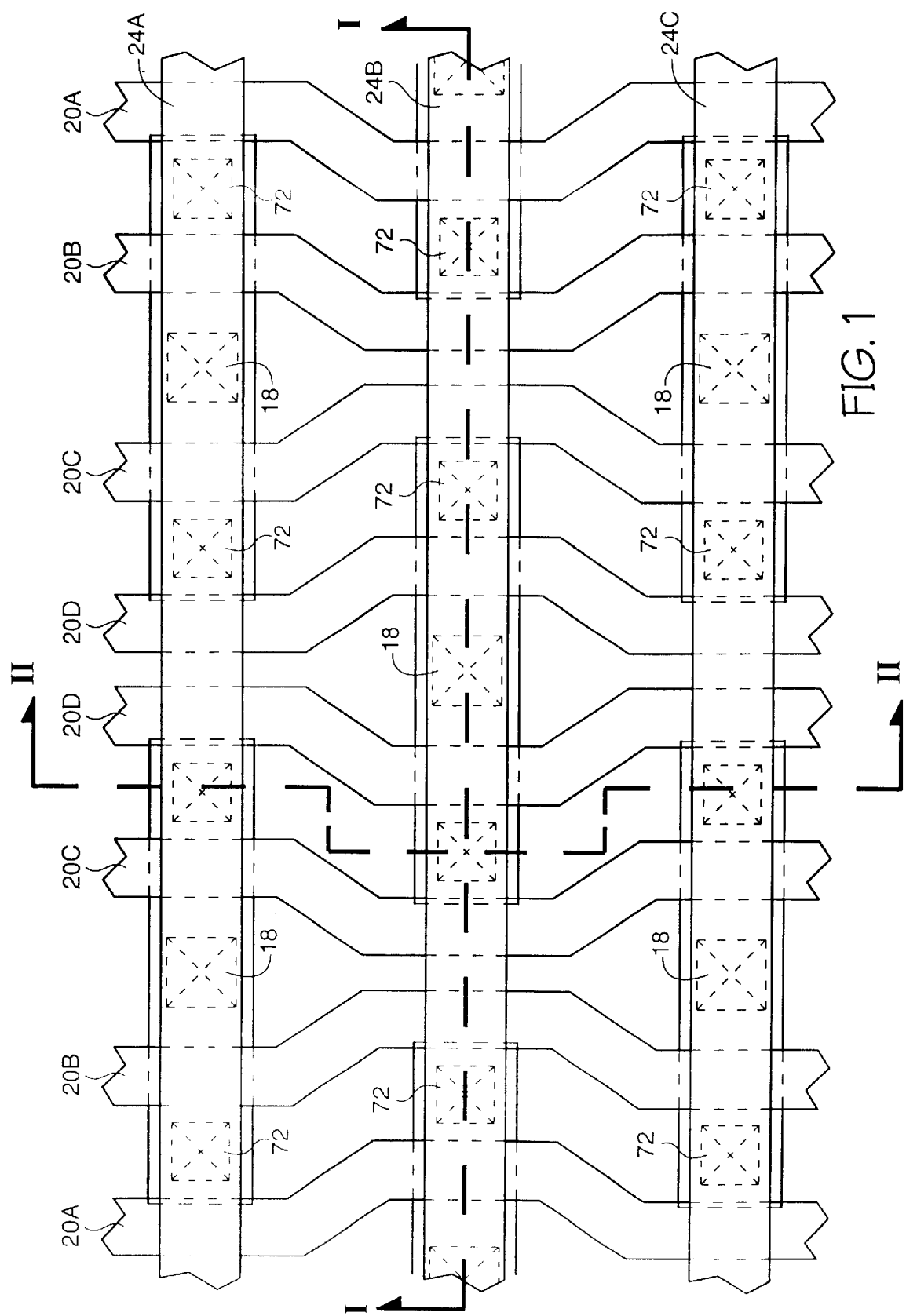
FIG. 1 is a plan view of a portion of a DRAM memory cell array illustrating one embodiment of the invention.

FIG. 1 is a plan/top view of a portion of a DRAM IC chip memory cell array. FIGS. 2A and 2B are cross sections of a portion of the memory cell array along the lines A—A and B—B in FIG. 1, respectively. FIG. 2A illustrates memory cells 10 and 12, and bitline contact 18 common to or shared by memory cells 10 and 12. Referring to FIGS. 1, 2A and 2B, the memory cell array comprises wordlines 20a, 20b, 20c and 20d located above substrate 22 extending in the row direction and bitlines 24a, 24b and 24c located above and extending in the column direction generally perpendicular to wordlines 20a, 20b, 20c and 20d. Memory cells 10 and 12 comprise access transistors 26 and capacitors 28. An isolation structure 30 surrounds memory cells 12 and their common bitline contact 18.

Impurity diffused regions 32 and 34 are formed on the surface of substrate 22 on both sides of gate electrodes 36 (wordlines 20a and 20d) of access transistors 26. Gate insulating layers 38, typically made of silicon dioxide, are interposed between gate electrodes 36 and substrate 22. Gate electrodes 36, gate insulating layers 38 and impurity diffused regions 32 and 34 constitute access transistors 26. Bottom electrodes 40 are formed on one side over gate electrodes 36 with first insulating layers 42 interposed therebetween. A center portion of bottom electrodes 40 contacts impurity regions 32. The other side of bottom electrodes 40 is formed over wordlines lob and 20c with second insulating layers 44 interposed therebetween. Dielectric layers 46 are formed over bottom electrodes 40. Top electrodes 48 are formed over dielectric layers 46. Bottom electrodes 40, dielectric layers 46 and top electrodes 48 constitute capacitors 28. Capacitors 28 as illustrated in FIG. 2 are commonly referred to as "stacked" capacitors.

Figure 3:
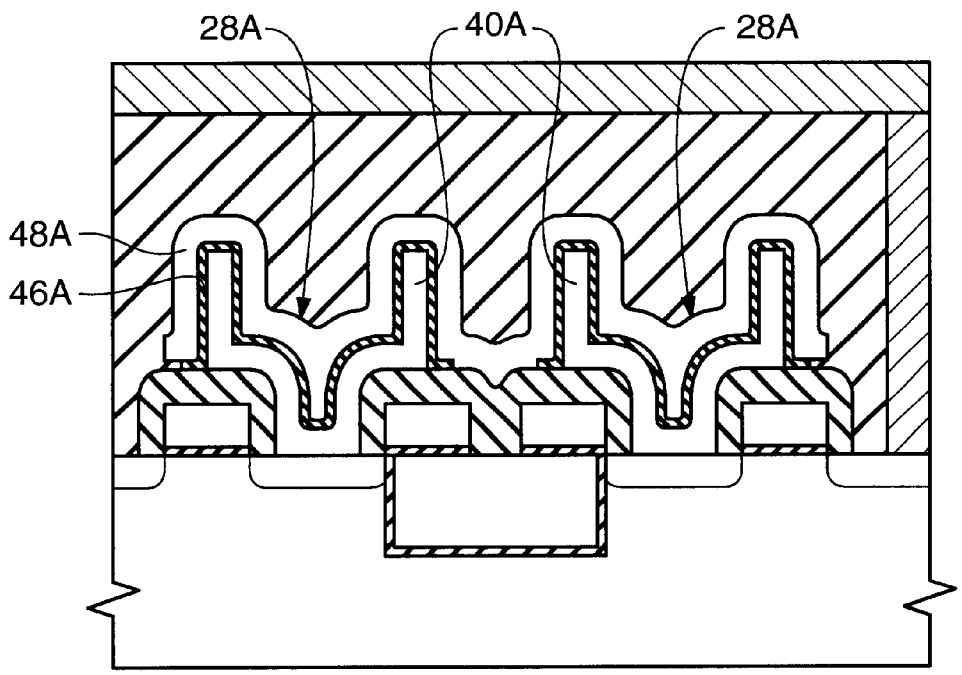
FIG. 3 is a partial cross section view taken along line A—A in FIG. 1 illustrating the invention in a container cell capacitor DRAM.

In an alternative embodiment illustrated in FIG. 3, a container cell capacitor 28a is used. Container cell capacitor 28a comprises bottom electrodes 40a, dielectric layers 46a and top electrodes 48a formed in the same locations as the corresponding components of the stacked capacitors preciously described. Container cell capacitors 28a differ from stacked capacitors 28 in that the sides of bottom electrodes 40a of container cell capacitors 28a project upward above and generally perpendicular to gate electrodes 36 and wordlines 20b and 20c, whereas the sides of bottom electrodes 40 of stacked capacitors 28 are generally parallel to gate electrodes 36 and wordlines 20b and 20c.

Referring again to FIGS. 2A and 2B, trench 50 is formed in the surface of substrate 22 beneath and, overlapping wordlines 20b and 20c in the column direction and, surrounding memory cells 12 and their common bitline contact 18. Trench 50 is lined with trench lining 52 and then filled with polysilicon to form floating gate 54. Trench lining 52 is a thin layer of insulating material typically made of silicon dioxide. The surface of floating gate 54 is substantially coplanar with the surface of substrate 22. Third insulating layer 56 is interposed between floating gate 54 and wordlines 20b and 24c. Trench 50, trench lining 52 and floating gate 54 constitute isolation structure 30.

In operation, and referring to FIG. 2A, an electrical charge is injected into floating gates 54 by applying a charging voltage to one or both wordlines 20b and 20c, thereby creating Fowler-Nordheim currents 58 that inject electrical charges into floating gate 54 from substrate 22. The charges that are injected into floating gate 54 will be either positive or negative depending on the doping of silicon substrate 22 and polysilicon floating gate 54. The Fowler-Nordheim current is created as electrons (or holes) tunnel through the relatively thin trench lining 52 oxide layer.

In the preferred embodiment, and for field width or active area spacing of about 0.25 microns, substrate 22 is p-type material having a doping level of about $3 \times 10^{15}$ atoms per $cm^3$. Floating gate 54 is n-type material having a resistance of about 32 ohms per square. Trench lining 52 has a thickness of 80–200 angstroms and third insulating layer 56 has a thickness of 200–500 angstroms. A charging voltage of 9–13 volts is sufficient to create the desired Fowler-Nordeim currents to inject electrical charges into floating gate 54. The currents thus created are very low and may be maintained as long as necessary (up to 10 seconds) to inject sufficient charges into floating gate 54 to provide the requisite isolation. The specific charging voltage, corresponding currents, and the length of time the charging voltage is applied will vary depending on the depth of trench 50, the thicknesses of trench lining 52 and gate oxide layer 56, and the cell spacing.

The electrically charged floating gate 54 provides two dimensional isolation between access transistors 26 by impeding current flow between impurity diffused regions 32. Floating gate 54 also isolates bitline contacts 18 from one another by impeding current flow between impurity diffused regions 34. Trench 50 forms a physical barrier to current flow between impurity diffused regions 32 to further isolate transistors 26 and bitline contacts 18. Utilization of electrically charged floating gate 54 reduces the depth of trench 50 that is necessary to achieve adequate isolation. Thus, the aspect ratio of trench 50 can be reduced as necessary to accommodate reduced cell spacing while still maintaining adequate isolation.

Figure 4:
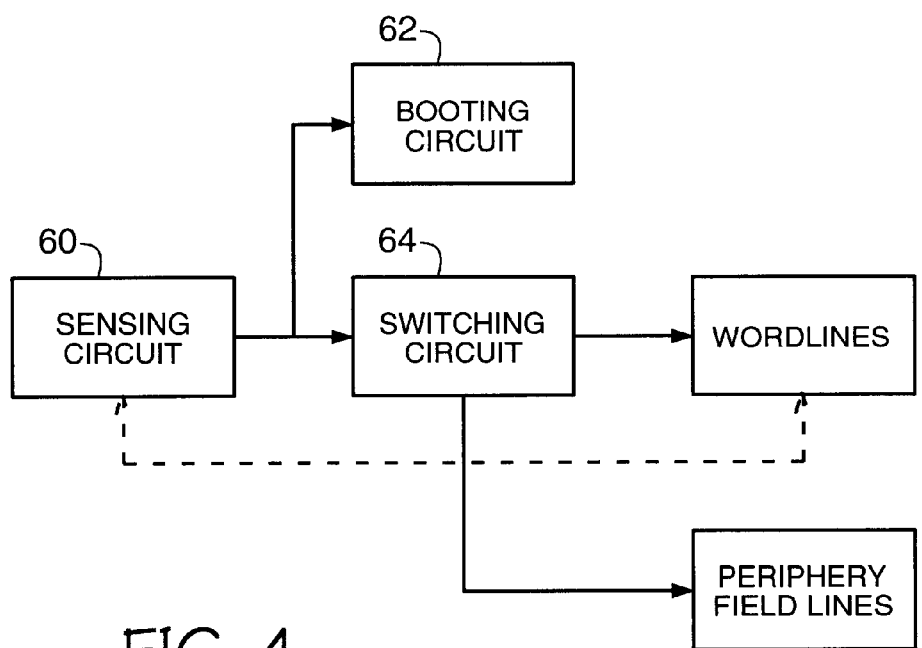
FIG. 4 is a block diagram illustrating one aspect of the invention.

Referring now to FIG. 4, because the charge initially injected into floating gate 54 will dissipate over time, the present invention includes: a sensing circuit 60 for sensing the charge on the floating gate; a booting circuit 62 for applying a charging voltage to wordline(s) 20*b* and/or 20*c*; and, a switching circuit 64 for connecting workline(s) 20*b* and/or 20*c* to the booting circuit when the charge on floating gate 54 falls below a level necessary to maintain adequate isolation, and connecting wordline(s) 20*b* and/or 20*c* back to an operating circuit when the charge on floating gate 54 is greater :than the predetermined level.

In the preferred embodiment, sensing circuit 60 is a conventional comparator or invertor type circuit well known in the art. Sensing circuit 60 is connected to impurity diffused regions 32 to detect current passing through access transistor 26. A threshold voltage is applied to gate electrode 36. If access transistor 26 "turns on" and current passes through access transistor 26, then sensing circuit 60 detects the current and thereby initiates the charging process previously described. Charging will continue until no current passes through access transistor 26 at the threshold voltage. Charging may continue for a specified additional time to maintain the threshold voltage after some decay of the charge on floating gate 59. Since the area of floating gate 54 is at least twice the area of wordline 20*a* or 20*b*, the charging time will be relatively long (up to 10 seconds). But charging is necessary only infrequently so that the charge time is not cumbersome to the operation of the device. In addition, the leakage check described above may be done during power-up of the device to further minimize the impact of charging.

Figure 5A:
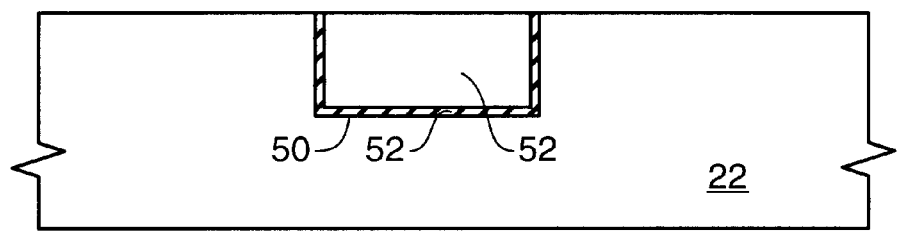
FIGS. 5A–5F are cross section views illustrating the steps of forming a memory cell of a DRAM incorporating the present invention.

Another aspect of the invention provides a method of making isolation structure 30, which method can be integrated into the overall manufacture of a DRAM IC chip as shown in FIGS. 5A–5F. The deposition, patterning and etching steps necessary to manufacture a DRAM incorporating the present invention are all conventional and well known in the art. Referring to FIG. 5A, trench 50 is patterned and etched into substrate 22 using conventional photolithographic and chemical etching techniques. Trench lining 52, made of silicon dioxide, is formed on the surfaces of trench 50 by thermal oxidation. The lined trench is filled with polysilicon by Chemical Vapor Deposition (CVD) at least to the surface of substrate 22 to form floating gate 54. If necessary, floating gate 54 is etched back to be substantially coplanar with the surface of substrate 22. Impurities are then ion implanted in floating gate 54.

Figure 5B:
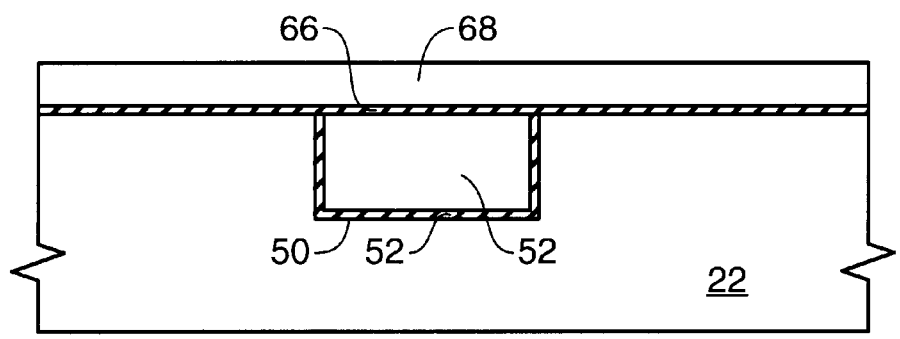
Figure 5C:
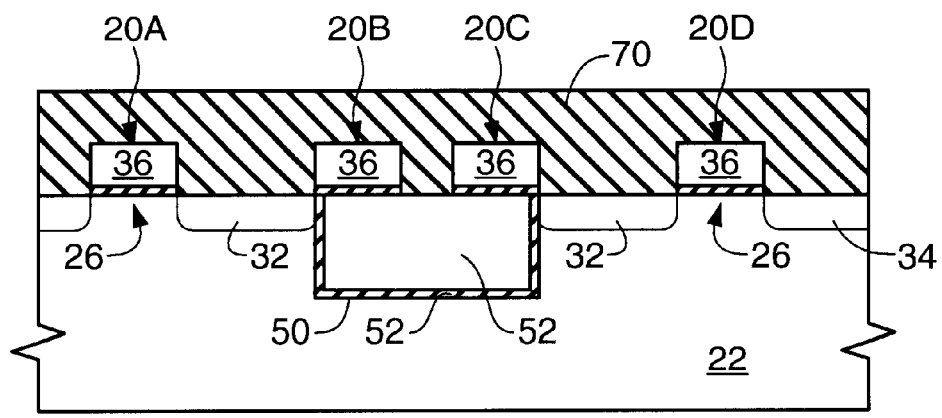
Figure 5D:
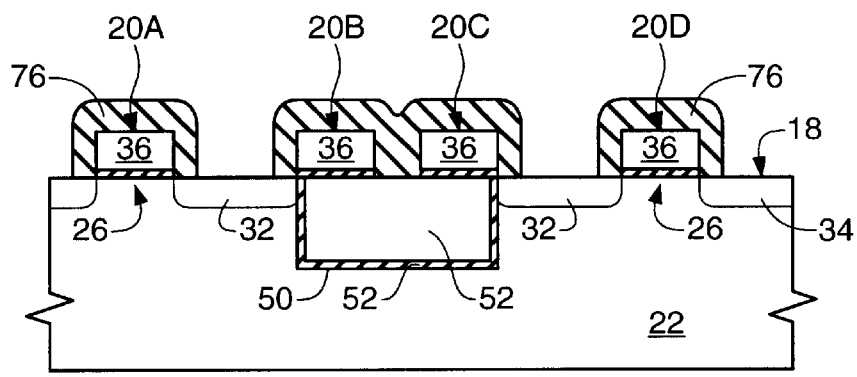

Referring to FIG. 5B, a gate oxide layer 66 is formed over the surface of substrate 22 and a polysilicon layer 68 is formed over gate oxide layer 66. Gate oxide layer 66, which will typically be formed by thermal oxidation, will form more rapidly over the polysilicon in trench 50 than it will over silicon substrate 22. Therefore, and depending on the doping level of the polysilicon in trench 50, gate oxide layer 66 may be up to twenty-five percent thicker over trench 50 than it is over the remaining portion of substrate 22. The gate oxide and polysilicon layers are patterned and etched to form gate electrode 36 (wordline 20*d*) of access transistor 26 and wordline 20*c* as shown in FIG. 5C. Impurities are implanted in the surface of substrate 22 using wordlines 20*c* and 20*d* and gate oxide layer 66 as masks to form impurity diffused regions 32 and 34. A second oxide layer 70 is stacked over substrate 22. Oxide layer 70 is patterned and etched to form buried contact region 72 at impurity diffused region 32, bitline contact 18 at impurity diffused region 34, and sidewalls 76 adjoining gate electrode 36 and wordline 20*c*. This resulting structure is shown in FIG. 5D.

Figure 5E:
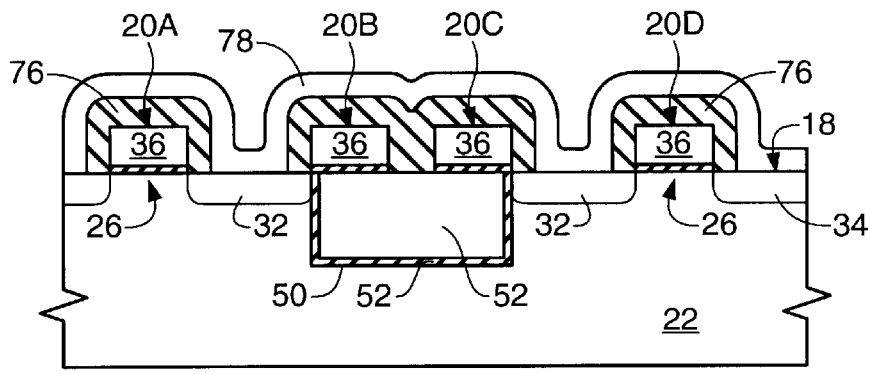
Figure 5F:
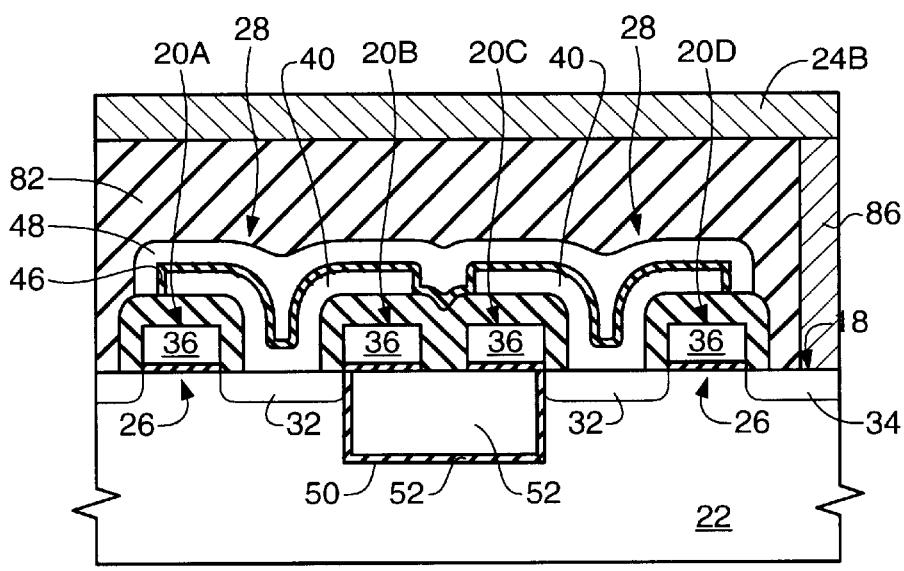

Referring to FIGS. 5E and 5F, a second polysilicon layer 78 is stacked over substrate 22. Second polysilicon layer 78 is patterned and etched to form bottom electrode 40 of capacitor 28. Bottom electrode 90 extends from above gate electrode 36 to above wordline 20*c* passing along and in contact with impurity diffused region 32. Dielectric layer 46 is formed over bottom electrode 40. Dielectric layer 46 is made of a thin nitride film, oxide-nitride-oxide (ONO) film or other suitable material. A third polysilicon layer is then stacked over substrate 22, and patterned and etched to form top electrode 48 of capacitor 28. Thick layer 82, made of borophosphorous silicate glass (BPSG) or other suitable insulator, is formed over the exposed upper surfaces of the structure previously formed. Thick BPSG layer 82 is patterned and etched to form an opening for metal post 86. Metal post 86 and bitline 24*b* are formed using metal deposition techniques well known in the art.

Various modifications to and applications of the invention as described herein may be made without departing from the spirit and scope of the invention. Accordingly, the invention is limited only by the terms of the claims appended hereto.

I claim:

1. An isolation structure for semiconductor devices that include a substrate having element forming regions on which semiconductor elements are formed and an isolation structure surrounding each element forming region to provide a plurality of element forming regions electrically isolated from each other, the isolation structure comprising a trench in the substrate, the trench filled with electrically charged polysilicon completely surrounded by insulating material.

2. An isolation structure for semiconductor devices having a substrate, a plurality of word lines arranged parallel to each other and extending in a row direction above the substrate and a plurality of bitlines arranged parallel to each other and extending in a column direction generally perpendicular to and above the word lines, the isolation structure comprising a trench in the substrate, the trench filled with electrically charged polysilicon completely surrounded by insulating material.

* * * * *